(12) United States Patent
Schippel et al.

(10) Patent No.: US 12,432,988 B2
(45) Date of Patent: Sep. 30, 2025

(54) SEMICONDUCTOR DEVICE INCLUDING SUBSTRATE LAYER WITH FLOATING BASE REGION AND GATE DRIVER CIRCUIT

(71) Applicant: Infineon Technologies Austria AG, Villach (AT)

(72) Inventors: Christian Schippel, Dresden (DE); Dirk Priefert, Moers (DE); Felix Simon Winterer, Munich (DE); Remigiusz Viktor Boguszewicz, Essen (DE)

(73) Assignee: Infineon Technologies Austria AG, Villach (AT)

( * ) Notice: Subject to any disclaimer, the term of this patent is extended or adjusted under 35 U.S.C. 154(b) by 415 days.

(21) Appl. No.: 18/110,512

(22) Filed: Feb. 16, 2023

(65) Prior Publication Data

US 2023/0261040 A1    Aug. 17, 2023

(30) Foreign Application Priority Data

Feb. 17, 2022   (EP) .................................... 22157261

(51) Int. Cl.

| | |
|---|---|
| H10D 62/10 | (2025.01) |
| H10D 84/60 | (2025.01) |
| H10D 89/60 | (2025.01) |
| H10D 8/25 | (2025.01) |
| H10D 10/40 | (2025.01) |
| H10D 64/00 | (2025.01) |

(52) U.S. Cl.
CPC ......... *H10D 62/102* (2025.01); *H10D 84/617* (2025.01); *H10D 89/611* (2025.01); *H10D 8/25* (2025.01); *H10D 10/421* (2025.01); *H10D 64/112* (2025.01)

(58) Field of Classification Search
CPC .. H10D 62/102; H10D 84/617; H10D 89/611; H10D 8/25; H10D 10/421; H10D 64/112; H10D 87/00; H10D 89/601; H10D 84/409; H01L 23/50
See application file for complete search history.

(56) References Cited

U.S. PATENT DOCUMENTS 5,672,899 A *  9/1997  Boguszewicz ......... H10D 88/00
                                                257/504
5,780,905 A    7/1998  Chen et al.
(Continued)

FOREIGN PATENT DOCUMENTS

WO    2014199608 A1    12/2014

*Primary Examiner* — Yasser A Abdelaziez
(74) *Attorney, Agent, or Firm* — Murphy, Bilak & Homiller, PLLC

(57) ABSTRACT

A semiconductor device includes a substrate layer having a floating base region of a first conductivity type. A first well of a second conductivity type and the floating base region form a first pn junction. A first conductive structure is electrically connected to the first well. A barrier region of the second conductivity type and the floating base region form an auxiliary pn junction. A second conductive structure is electrically connected to the floating base region through a rectifying structure. A pull-down structure is configured to produce a voltage drop between the barrier region and the second conductive structure, when charge carriers cross the auxiliary pn junction.

15 Claims, 12 Drawing Sheets

(56) References Cited

U.S. PATENT DOCUMENTS

| | | |
|---|---|---|
| 10,242,979 B1 | 3/2019 | Edwards |
| 2007/0073807 A1* | 3/2007 | Bobde ................ H10D 30/0295 |
| | | 257/E29.066 |
| 2015/0137305 A1* | 5/2015 | Schmenn ................ H01L 21/22 |
| | | 257/491 |
| 2016/0133620 A1 | 5/2016 | Pedone et al. |
| 2017/0084606 A1 | 3/2017 | Meiser et al. |
| 2021/0217746 A1* | 7/2021 | Arnaud ................ H10D 8/021 |

* cited by examiner

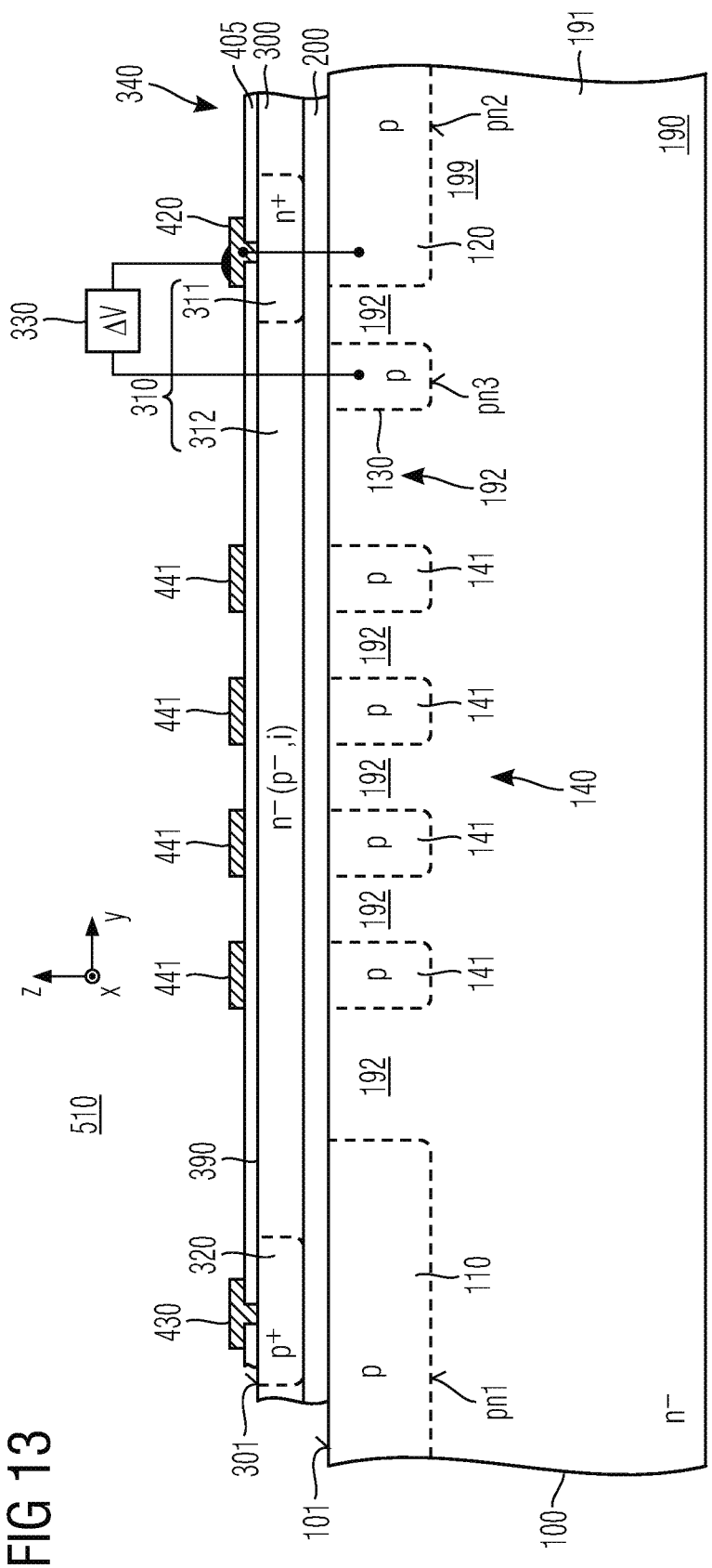

SEMICONDUCTOR DEVICE INCLUDING SUBSTRATE LAYER WITH FLOATING BASE REGION AND GATE DRIVER CIRCUIT

TECHNICAL FIELD

Examples of the present disclosure relate to a semiconductor device with a substrate layer including a floating base region, in particular, a semiconductor device having a semiconductor-on-insulator structure. The present disclosure further relates to integrated circuits used in power electronics, such as gate driver circuits.

BACKGROUND

Power electronic assemblies include power semiconductor switches such as IGBTs (insulated gate bipolar transistor) and/or MOSFETs (metal oxide semiconductor field effect transistor) for controlling inductive loads in power conversion circuits and motor control applications, as well as integrated circuits for controlling and monitoring the power semiconductor switches. An example of such an integrated circuit is the gate driver circuit, which enables a microcontroller or digital signal processor (DSP) to efficiently turn on and turn off power semiconductor switches. A buffer stage of the gate driver circuit includes output transistors that drive the comparatively high input current of power semiconductor switches. In gate driver circuits based on SOI (semiconductor-on-insulator) technology, the output transistors of each buffer stage may be formed in a thin semiconductor film with dielectric isolation on all sides. The dielectric insulation prevents latch-up and almost completely eliminates any leakage current.

There is a constant need to further improve the device characteristics and operational reliability of power electronics devices at low additional effort.

SUMMARY

Embodiments of the present disclosure may improve the temperature stability of semiconductor device characteristics and the robustness of semiconductor devices, in particular the resistance to destruction of semiconductor-on-insulator devices under high voltage stress at elevated temperatures.

To this purpose, a semiconductor device according to the present disclosure includes a substrate layer that includes a floating base region of a first conductivity type. The semiconductor device further includes a first well of a second conductivity type, wherein the first well and the base region form a first pn junction. A first conductive structure is electrically connected to the first well. A barrier region of the second conductivity type and the base region form an auxiliary pn junction. A second conductive structure is electrically connected to the base region through a rectifying structure. A pull-down structure is configured to produce a voltage drop between the barrier region and the second conductive structure, when charge carriers cross the auxiliary pn junction.

In particular, when thermal electrons generated in the substrate layer flow into direction of a positive potential applied to the second conductive structure, the pull-down structure negatively biases the barrier region with respect to the floating base region, prevents further electrons from entering the barrier region and in this way counteracts a growth of a leakage current between the first and second conductive structures even at high temperatures, may improve temperature stability of device characteristics like maximum leakage current, and may improve the resistance to destruction under high voltage stress at elevated temperatures.

A gate driver circuit according to the present disclosure includes a substrate layer that includes a floating base region of a first conductivity type. The semiconductor device further includes a first well of a second conductivity type, wherein the first well and the base region form a first pn junction. A first conductive structure is electrically connected to the first well. A barrier region of the second conductivity type and the base region form an auxiliary pn junction. A second conductive structure is electrically connected to the base region through a rectifying structure. A pull-down structure is configured to produce a voltage drop between the barrier region and the second conductive structure, when charge carriers cross the auxiliary pn junction. A half-bridge driver circuit includes two transistors electrically connected in series between a high potential line and a low potential line.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a gate driver circuit and together with the description serve to explain principles of the embodiments. Further embodiments are described in the following detailed description and the claims. Features of the various illustrated embodiments may be combined with each other.

FIG. 13 is a schematic vertical cross-sectional view of a portion of a gate driver circuit including a desaturation diode according to a further embodiment.

DETAILED DESCRIPTION

Figure 1:
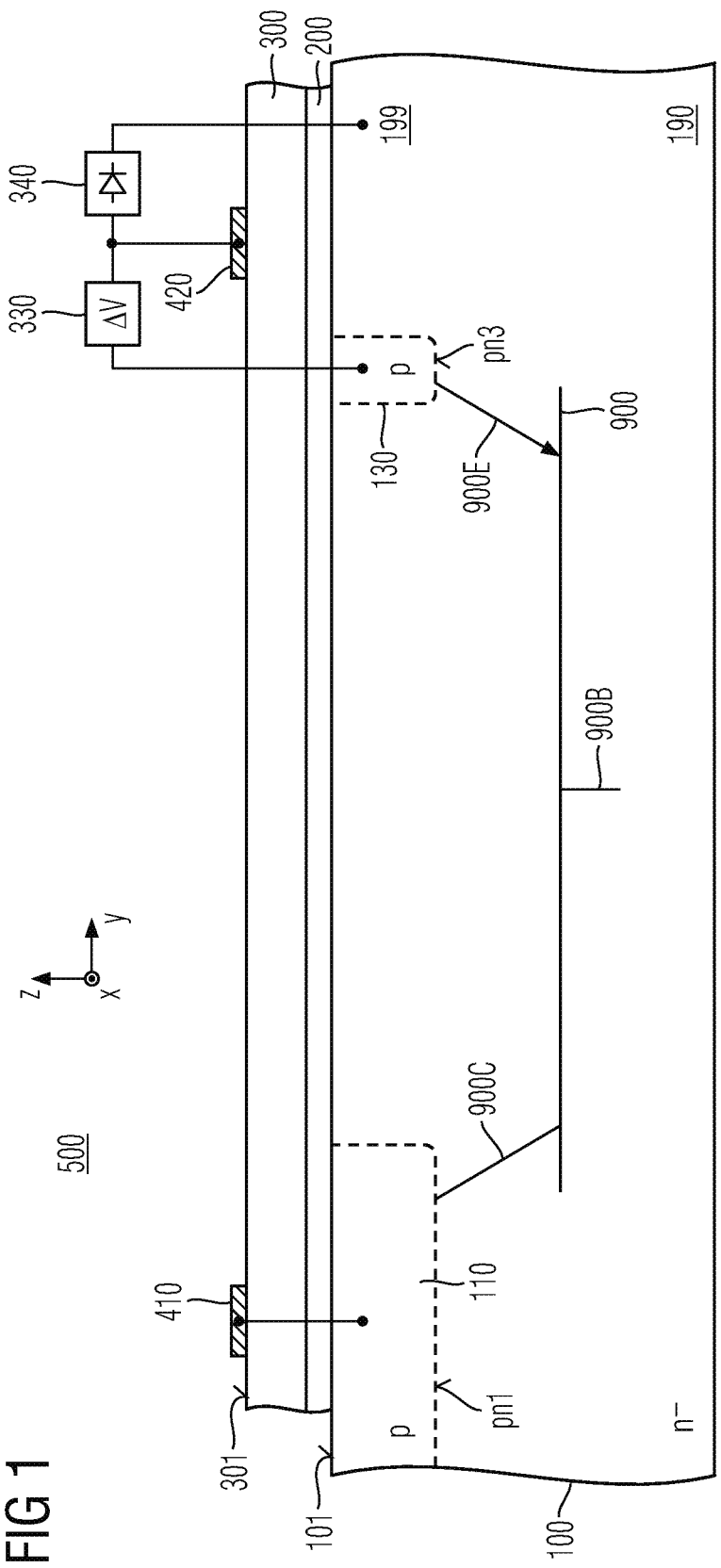
FIG. 1 is a schematic vertical cross-sectional view of a portion of a semiconductor device with a floating base region, a first well, and a pull-down structure that produces a voltage drop between a barrier region and a conductive structure according to an embodiment.

In the following detailed description, reference is made to the accompanying drawings, which form a part hereof and in which are shown by way of illustrations specific embodiments in which a semiconductor device and a gate driver circuit may be practiced. Other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30V, for example 48V, 100V, 600V, 1.6 kV, 3.3 kV or more and with a nominal on-state current or forward current of at least 200 mA, for example 1A, 10 A or more.

MOSFETs (metal oxide semiconductor field effect transistor) are voltage controlled devices and include all types of IGFETs (insulated gate field effect transistors) with gate electrodes based on doped semiconductor material and/or metal and with gate dielectrics made of oxide and/or dielectric materials other than oxides.

An ohmic contact describes a non-rectifying electrical junction between two conductors, in particular between a semiconductor material and a metal. The ohmic contact has a linear or approximately linear current/voltage (I/V) curve in the first and third quadrant of the I/V diagram as with Ohm's law.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The present disclosure concerns a semiconductor device including a substrate layer that includes a floating base region of a first conductivity type. The base region and a first well of a second conductivity type form a first pn junction. A first conductive structure is electrically connected to the first well.

The substrate layer may contain or consist of a single-crystalline semiconductor material, e.g., an elemental semiconductor such as silicon (Si) or germanium (Ge) or a compound semiconductor and may have a uniform or at least approximately uniform vertical extension (layer thickness). The substrate layer may be a disc or may be part of an SOI (semiconductor-on-insulator) structure.

The base region floats, i.e., the base region is without ohmic connection into or from which charge packets are transferred by overlapping or adjacent transfer gates or resistive connections.

The first well may extend from a first surface of the substrate layer into the substrate layer, wherein a vertical extension of the first well orthogonal to the first surface may be smaller than a vertical extension of the substrate layer. The first conductive structure may be a homogenous structure or may include two or more layers of different materials.

The semiconductor device may further include a barrier region of the second conductivity type, wherein the barrier region and the base region form an auxiliary pn junction. A second conductive structure is electrically connected to the base region through a rectifying structure.

The barrier region may extend from the first surface of the substrate layer into the substrate layer, wherein a vertical extension of the barrier region may be smaller than a vertical extension of the substrate layer. The first well and the barrier region are laterally separated from each other, e.g. by a separation section of the base region.

The second conductive structure may be a homogenous structure or may include two or more layers of different materials. The first and second conductive structures may be formed completely outside the substrate layer.

The rectifying structure may include at least one Schottky contact and/or at least one pn junction, wherein the at least one Schottky contact and/or the at least one pn junction may be formed outside the substrate layer or in the substrate layer.

The semiconductor device may further include a pull-down structure configured to produce a voltage drop between the barrier region and the second conductive structure, when charge carriers cross the auxiliary pn junction.

The pull-down structure may be a single element or a combination of elements formed outside the substrate layer. The voltage drop may be generated by stored charges, by a current flow through a passive element connected between the barrier region and the second conductive structure, or by a reverse current through one or more pn junctions formed inside or outside the substrate layer, e.g. through a diode element such as a Zener diode. The voltage drop generated by the pull-down structure may be in a range up to 2V.

If the first conductivity type is n conductivity, the p conductive first well, the n conductive floating base region, and the p conductive barrier region form a pnp structure of a parasitic bipolar transistor. If a positive voltage is applied between the second conductive structure and the first conductive structure, then at least a connection section of the floating base region next to the connection to the second conductive structure is near the high potential. Thermal electrons generated in the floating base region migrate toward the high potential and enter the barrier region. When flowing through the pull-down structure, the electrons induce a voltage drop across the pull-down structure. On the other hand, the rectifying structure connects the floating base region with only low voltage loss directly to the high potential such that the voltage drop across the pull-down structure negatively biases the barrier region with respect to the portion of the floating base region next to the barrier region. A negative bias of 2V or even less, for example, about 1.5V may be sufficient to prevent further electrons from entering the barrier region and prevents holes from being injected from the barrier region into the base region via the auxiliary pn junction. In this way, the pull-down structure counteracts a growth of the leakage current between the first and second conductive structures even at high temperatures, and improves device robustness in particular for operation under high bias voltage and at elevated temperatures.

According to an embodiment, the semiconductor device may further include an insulator layer formed on a first surface of the substrate layer and a semiconductor layer formed on the insulator layer. The first well and the barrier region may extend from the first surface into the substrate layer. The first and second conductive structures may include portions formed on a top surface of the semiconductor layer and/or in the semiconductor layer.

In particular, the substrate layer, the insulator layer and the semiconductor layer form an SOI (silicon-on-insulator) structure, wherein each of the substrate layer, the insulator layer and the semiconductor layer may have approximately uniform thickness.

The first conductive structure may extend from the side of the semiconductor layer through the insulator layer to or into the substrate layer. The second conductive structure may extend from the side of the semiconductor layer through the insulator layer to or into the substrate layer.

The pull-down structure may include a pn junction, e.g. a semiconductor diode, formed above the semiconductor layer or in the semiconductor layer. The rectifying structure may include a pn junction, e.g. a semiconductor diode, formed above the semiconductor layer, in the semiconductor layer and/or in the substrate layer.

According to an embodiment, the semiconductor device may further include a termination structure between the first well and the barrier region.

The termination structure may improve the voltage blocking capability between the first conductive structure and the second conductive structure, and between first elements electrically connected to the first conductive structure and second elements electrically connected to the second conductive structure. In particular, the termination structure may improve the voltage blocking capability of the portion of the substrate layer between the first well, which is connected to the first conductive structure, and a second well, which may be connected to the second conductive structure and which may be formed at a side of the barrier region opposite to the first well.

The termination structure may include guard regions of the second conductivity type. The guard regions may extend from the first surface into the substrate layer, in particular into the base region. The guard regions may be laterally separated from each other, e.g. by separation sections of the base region. The termination structure may further include conductive field plates formed on the top surface of the semiconductor layer.

According to an embodiment, the first well may laterally surround the barrier region.

The barrier region may be circular or rectangular with or without rounded corners. In particular, the barrier region may be ring-shaped and may laterally surround a portion of the substrate layer. The termination structure may surround the barrier region. The first well may surround a portion of the substrate layer that includes the termination structure and the barrier region, wherein the termination structure laterally separates the first well and the barrier region. The termination structure may have approximately the same width along the whole circumference.

According to an embodiment, the semiconductor device may further include a second well of the second conductivity type, wherein the second well and the base region form a second pn junction, wherein the barrier region may be formed between the first well and the second well, and wherein the second well and the second conductive structure may be electrically connected.

In particular, a low-resistive ohmic path may electrically connect the second well and the second conductive structure. The second pn junction between the second well and the base region forms the rectifying structure or at least part of the rectifying structure. In other words, the rectifying structure includes the second pn junction and/or the second pn junction forms an embodiment of the rectifying structure.

A separation section of the base region may separate the barrier region and the second well. A dopant concentration in the separation section may be the same as in a main section of the base region below the first and second wells, or may be higher in at least a part of the separation section. In particular, the separation section may include a surface section extending between the barrier region and the second well from the first surface into the substrate layer, wherein a vertical extension of the surface section may be smaller than a vertical extension of the barrier region, and wherein a mean net dopant concentration in the surface section is at least twice as high as in the lower section of the separation section between the surface section and the main section.

The barrier region collects thermal electrons controlled by the electric field in the termination region, prevents further thermal electrons from reaching the second well, counteracts a further increase of a leakage current between the first and second conductive structures, and in this way reduces the risk for a thermal runaway in the substrate layer of the semiconductor device.

According to an embodiment, the barrier region may laterally surround the second well.

In addition, the termination structure may surround the portion of the substrate layer including both the barrier region and the second well. The ring-shaped barrier region collects thermal electrons on all sides of the second well, efficiently prevents the thermal electrons from reaching the second well, and in this way efficiently counteracts a further increase of a leakage current between the first and second conductive structures.

According to an embodiment, the barrier region has a first efficiency for charge carrier injection into the base region and the second well has a second efficiency for charge carrier injection into the base region, wherein the second efficiency is lower than the first efficiency.

Charge carrier injection efficiency is a measure of the efficiency of a semiconductor junction when a forward bias is applied, and is equal to the current of injected minority carriers divided by the total current across the junction.

The lower injection efficiency of the second well further reduces the risk of thermal electrons entering the second well and triggering the injection of holes from the second well into the base region.

According to an embodiment, the barrier region may include at least two laterally separated barrier portions.

In particular, the barrier region may include two or more concentric, ring-shaped barrier portions, wherein each ring-shaped barrier portion surrounds the second well.

The pull-down structure may connect at least one of the barrier portions, e.g. the outer most barrier portion averted from the second well, with the second conductive structure. Alternatively, the pull-down structure may connect some or all barrier portions with the second conductive structure.

For example, the pull-down structure may include two or more sub-structures. Each sub-structure may include a pn junction. Each sub-structure may be connected between one of the barrier portions and the second conductive structure. Alternatively, the sub-structures may be electrically connected in series to form a string of sub-structures, and each barrier portion is electrically connected to another node of the string of sub-structures. Each sub-structure may be a Zener diode, by way of example.

According to an embodiment, the rectifying structure may include a rectifying element formed outside the substrate layer.

For example, the rectifying element may be a semiconductor diode formed in the semiconductor layer or a semiconductor diode mounted on conductive pads on a top surface of the semiconductor layer.

According to an embodiment, the rectifying structure may include a heavily doped contact region formed in the substrate layer, wherein the contact region has the first conductivity type, and wherein the contact region and the base region form a unipolar junction.

In particular, the dopant concentration in the heavily doped contact region may be sufficiently high such that the second conductive structure and the contact region form a low-resistive ohmic contact.

According to an embodiment, the pull-down structure may include at least one of a capacitive structure and a resistive structure. More generally, the pull-down structure may exclusively include linear, bilateral circuit elements.

Alternatively, the pull-down structure may include at least one non-linear, e.g., a unilateral circuit element to avoid excessive voltage drop across the pull-down structure.

According to an embodiment, the pull-down structure may include at least one pn junction formed outside the substrate layer.

In particular, the pull-down structure may include a Zener diode formed in the semiconductor layer.

According to an embodiment, the semiconductor device may further include a diode structure formed on the first surface, wherein the diode structure is electrically connected between the first conductive structure and the second conductive structure.

For example, the diode structure is formed in the semiconductor layer, wherein the anode region of the diode structure may be formed above the first well and the cathode region may be formed above the second well.

Another embodiment of the present disclosure is related to a gate driver circuit. The gate driver circuit may include a substrate layer that includes a floating base region of a first conductivity type. A first well of a second conductivity type and the base region may form a first pn junction. A first conductive structure is electrically connected to the first well. A barrier region of the second conductivity type and the base region form an auxiliary pn junction. A second conductive structure is electrically connected to the base region through a rectifying structure. A pull-down structure is configured to produce a voltage drop between the barrier region and the second conductive structure, when charge carriers cross the auxiliary pn junction. The gate driver circuit may further include a half-bridge driver circuit that includes two transistors electrically connected in series between a high potential line and a low potential line.

According to an embodiment, the gate driver device may further include an insulator layer formed on a first surface of the substrate layer, wherein the first well and the barrier region extend from the first surface into the substrate layer. A semiconductor layer is formed on the insulator layer, wherein the first and second conductive structures are formed on a top surface of the semiconductor layer and/or in the semiconductor layer, and wherein the half bridge driver circuit is formed in the semiconductor layer.

FIG. 1 shows a portion of a semiconductor device with a silicon-on-insulator structure including a substrate layer 100, an insulator layer 200 formed on the substrate layer 100 and a thin semiconductor layer 300 formed on the insulator layer 200. The substrate layer 100, the insulator layer 200 and the semiconductor layer are stacked on each other in this order along a vertical direction parallel to a z-axis.

The substrate layer 100 may be a layer from crystalline semiconductor material such as single-crystalline silicon and has uniform or approximately uniform thickness along the z-axis.

The insulator layer 200 is formed on a planar first surface 101 of the substrate layer 100 oriented to a front side of the semiconductor device 500. The insulator layer 200 may be a homogenous layer or may include two or more vertically stacked sub-layers of different composition and/or structure. For example, the insulator layer 200 may include a silicon oxide layer, a silicon nitride layer, and/or a siliconoxynitride layer. The insulator layer 200 may have a uniform or almost uniform thickness in a range from 50 nm to 500 nm. A voltage blocking capability of the insulator layer 200 may be in a range from 200V to 1500V, e.g., about 300V.

The semiconductor layer 300 is formed on a planar surface of the insulator layer 200 and has a top surface 301 on the front side of a semiconductor device 500. The top surface 301 is planar and extends along two orthogonal axes (x-axis and y-axis) defining horizontal directions.

The semiconductor layer 300 may be a homogeneous semiconductor body of uniform thickness, wherein a thickness of the semiconductor layer 300 along the z-axis may be in a range from 200 nm to 3 μm, by way of example. The material of the semiconductor layer 300 is a single-crystalline elemental semiconductor like silicon (Si) or germanium (Ge), or a compound semiconductor like silicon germanium (Site).

The substrate layer 100 includes an n doped floating base region 190. A p doped first well 110 extends from the first surface 101 into the substrate layer 100. A vertical extension of the first well 110 is smaller than the layer thickness of the substrate layer 100. The first well 110 and the base region 190 form a first pn junction pn1.

At least a portion of a first conductive structure 410 is formed on the top surface 301 of the semiconductor layer 300 and is electrically connected to the first well 110 through, e.g., a contact structure extending through the semiconductor layer 300 and the insulator layer 200.

At a lateral distance to the first well 110, a p doped barrier region 130 extends from the first surface 101 into the substrate layer 100. A vertical extension of the barrier region 130 is smaller than the layer thickness of the substrate layer 100. The barrier region 130 and the first well 110 may have approximately the same vertical extension and the same vertical dopant profile. In particular, the barrier region 130 and the first well 110 may be formed by using the same ion implantation processes and the same ion implantation mask. The barrier region 130 and the base region 190 form an auxiliary pn junction pn3.

At least a portion of a second conductive structure 420, which is electrically connected to the base region 190 through a rectifying structure 340, is formed on the top surface 301 of the semiconductor layer 300. The anode of the rectifying structure 340 is directly connected to the second conductive structure 420. The cathode of the rectifying structure 340 is directly connected to a connection section 199 of the base region 190 in the vicinity of the barrier region 130. The rectifying structure 340 may include at least one Schottky contact and/or at least one pn junction, wherein the at least one Schottky contact and/or the at least one pn junction may be formed outside the substrate layer 100 or in the substrate layer 100.

A pull-down structure 330 is electrically connected between the barrier region 130 and the second conductive structure 420. Electrons crossing the auxiliary pn junction pn3 and flowing in the pull-down structure 330 in direction of the second conductive structure 420 generates a voltage drop between the barrier region 130 and the second conductive structure 420. This voltage drop counteracts an increasing flow of charge carriers across the auxiliary pn junction pn3.

The p doped first well 110 forms the collector 900C, the n doped floating base region 190 the base 900B and the p doped barrier region 130 the emitter 900E of a parasitic pnp bipolar transistor 900. When a positive voltage is applied between the second conductive structure 420 and the first conductive structure 410, the rectifying structure 340 clamps at least a connection section 199 of the floating base region 190 to a potential close to the high potential. Thermal electrons generated in the floating base region 190 flow toward the high potential, enter the barrier region 130, and flow through the pull-down structure 330 to the second conductive structure 420, wherein the induced voltage drop across the pull-down structure forces the potential of the barrier region 130 to a lower potential than the connection section 199 of the floating base region 190 such that the barrier region 130 gets negatively biased with respect to the connection section 199. The negative bias prevents further electrons from entering the barrier region 130 and prevents holes from being injected from the barrier region 130 into the base region 190 through the auxiliary pn junction pn3. In this way, the pull-down structure 330 counteracts a growth of the leakage current between the first and second conductive structures 410, 420 even at elevated temperatures, and improves device robustness.

Figure 2:
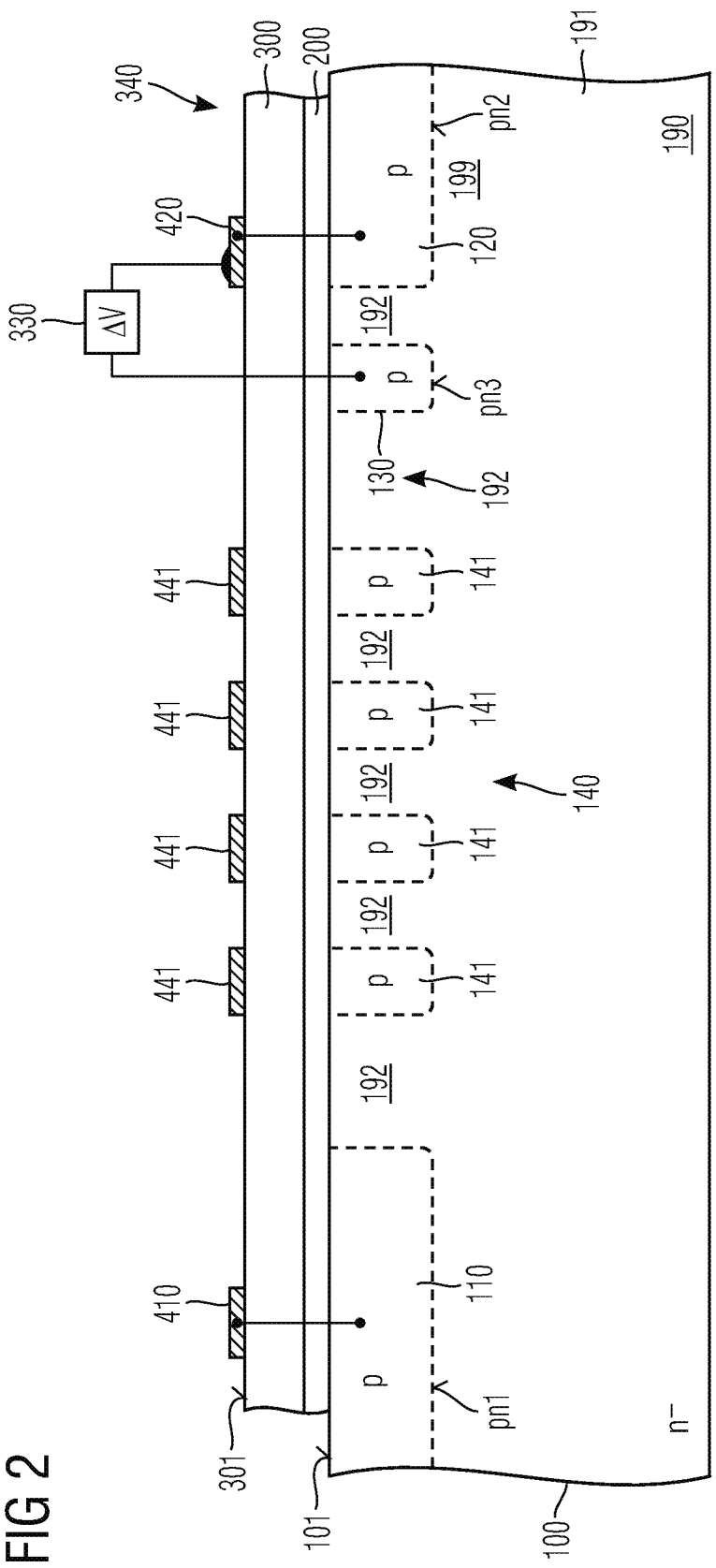
FIG. 2 is a schematic vertical cross-sectional view of a portion of a semiconductor device having a termination structure between a first well and a barrier region according to an embodiment.

In FIG. 2 the rectifying structure 340 includes a second pn junction pn2 formed in the substrate layer 100, wherein the second pn junction pn2 is formed by the junction between the base region 190 and a p doped second well 120. In particular, the junction between the base region 190 and the second well 120 is between the second well 120 and a connection section 199 of the base region 190, wherein the connection section 199 is in direct contact with the second well 120.

The second well 120 extends from the first surface 101 into the substrate layer 100. A vertical extension of the second well 120 is smaller than the layer thickness of the substrate layer 100. The second well 120 and the base region 190 form the second pn junction pn2. The second well 120 and the first well 110 may have approximately the same vertical extension and the same vertical dopant profile. In particular, the first well 110 and the second well 120 may be formed by using the same ion implantation processes and the same ion implantation mask.

The second conductive structure 420 is electrically connected to the second well 120 through, e.g., a contact structure extending through the semiconductor layer 300 and the insulator layer 200.

The second well 120 is formed on a side of the barrier region 130 averted from the first well 110, such that the barrier region 130 is formed between the first well 110 and the second well.

Without the barrier region 130, thermal electrons would be discharged only through the second pn junction pn2, thereby triggering the injection of holes into the base region 190. The additional local charge current flow thus induced would further raise the temperature locally and promote the generation of additional charge carriers, such that the semiconductor device 500 would eventually self-destruct by thermal runaway in the substrate layer, depending on the instantaneous voltage and temperature conditions.

Instead, the barrier region 130 prevents thermal electrons from reaching and entering the second well 120, and the pull-down structure 330 counteracts the injection of holes from the barrier region 130 into the base region 190 such that thermal runaway, if any, can only occur at much higher temperatures and bias voltages.

FIG. 2 further shows a termination structure 140 that includes p doped guard regions 141 and conductive field plates 441.

The guard regions 141 extend between the first well 110 and the barrier region 130 from the first surface 101 into the substrate layer 100. A vertical extension of the guard regions 141 is smaller than the layer thickness of the substrate layer 100. The guard regions 141 and the first well 110 may have approximately the same vertical extension and the same vertical dopant profile. In particular, the first well 110, the second well 120, the barrier region 130 and the guard regions 141 may be formed by using the same ion implantation processes and the same ion implantation mask.

Separation sections 192 of the base region 190 laterally separate the guard regions 141 from each other, the outermost guard region 141 and the first well 110, the innermost guard region 141 and the barrier region 130, and the barrier region 130 and the second well 120. At least surface sections of the separation sections 192 may be more heavily doped than a main section 191 of the base region 190, wherein the main section 191 extends below the first well 110, the guard regions 141, the barrier region 130, and the second well 120 horizontally through substrate layer 100.

The conductive field plates 441 are formed on the top surface 301 of the semiconductor layer 300, may be laterally separated from each other, and may be vertically aligned with the guard regions 141. Each guard region 141 may be assigned to one field plate 441 and each field plate 441 may be assigned to one guard region 141.

The termination structure 140 improves the voltage blocking capability of the portion of the substrate layer 100 between first elements having the potential of the first conductive structure 410, e.g., the first well 110, and second elements having at least approximately the potential of the second conductive structure 420, e.g., the barrier region 130 and the second well 120.

Figure 3:
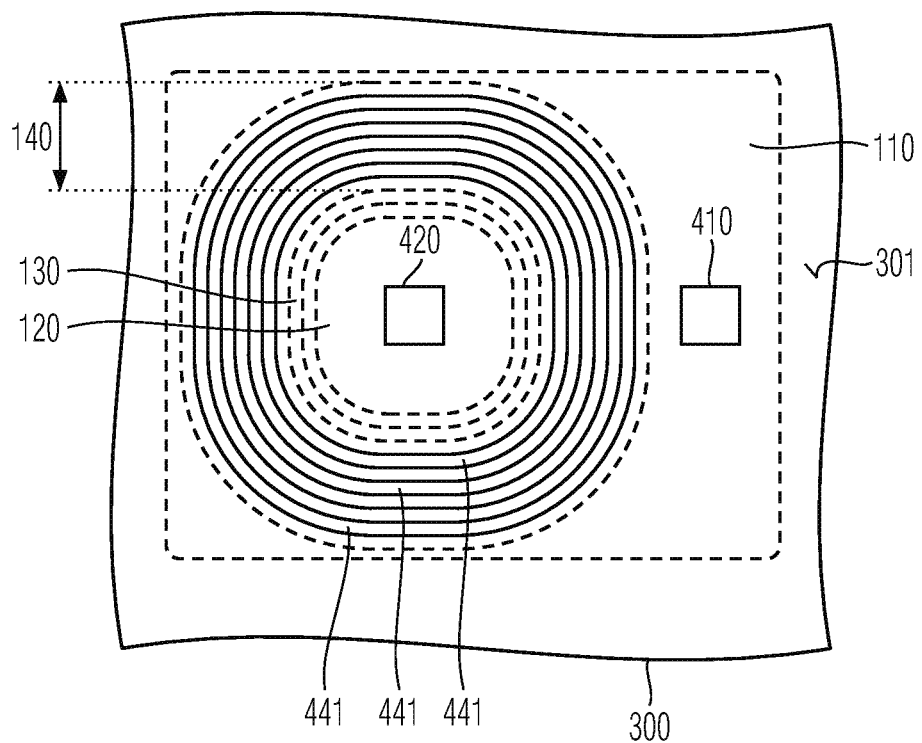
FIG. 3 is a schematic top view of a portion of a semiconductor device with a ring-shaped barrier region surrounding a second well according to an embodiment.

FIG. 3 shows a top view of the top surface 301 of a semiconductor layer 300. The dashed lines indicate the position of junctions between doped regions in a substrate layer below the semiconductor layer 300.

A first and a second conductive structure 410, 420 are formed at a distance from each other on the top surface 301. The first conductive structure 410 is formed above a section of a first well 110 in the substrate layer. The second conductive structure 420 is formed above a section of a second well 120, which is formed in the substrate layer. The second well 120 has an approximately rectangular horizontal cross-section with rounded edges. An annular barrier region 130 of uniform width completely surrounds the second well 120 in the substrate layer. A lateral distance between the barrier region 130 and the second well 120 is uniform. An annular shaped termination structure 140 completely surrounds a substrate portion that includes the annular barrier region 130 and the second well 120. The termination structure 140 includes field plates 441 formed on the top surface 301 and annular guard regions directly below each of the field plates 441.

The second well 120, the barrier region 130 and the termination structure 140 are concentric. The first well 110 has a rectangular outer contour and an opening in which the second well 120, the barrier region 130 and the termination structure 140 are formed. The first well 110 completely surrounds a substrate portion that includes the second well 120, the barrier region 130 and the termination structure 140.

Figure 4:
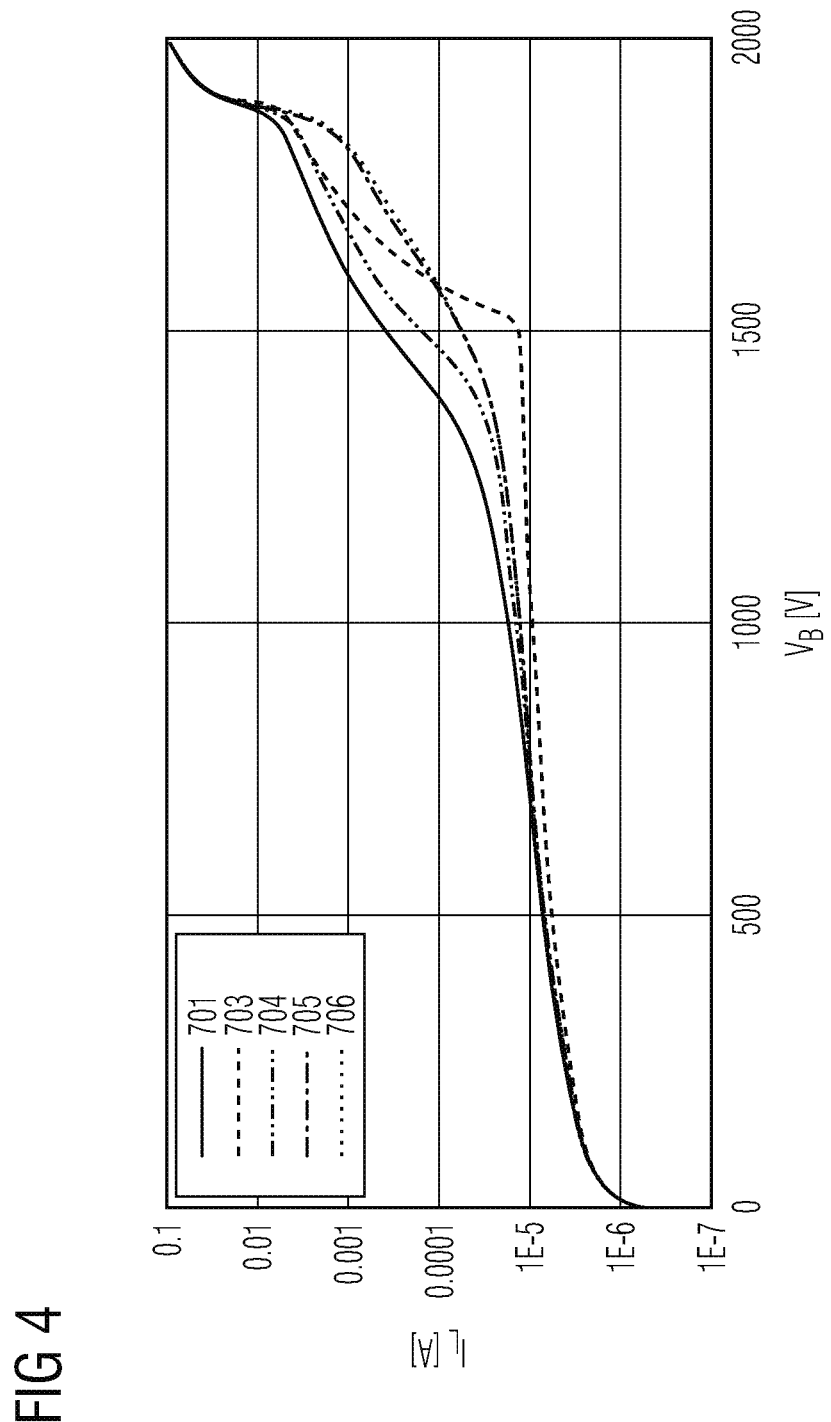
FIG. 4 is a schematic diagram showing the leakage current of a semiconductor device as a function of a bias voltage applied between a second and a first conductive structure, and is used to discuss the operation of various embodiments of a pull-down structure.

The curves in FIG. 4 show the leakage current IL as a function of the voltage bias VB for various pull-down structures at a temperature of about 120 degree Celsius. Curve 701 shows the leakage current IL for a reference device without barrier region. Curve 703 shows the leakage current IL for a semiconductor device that differs from the reference device by the presence of a barrier region biased at −10V with reference to the second well. Curve 704 shows the leakage current IL with a 10 kΩ resistor as pull-down structure between the barrier region and the second conductive structure. Curve 705 shows the leakage current IL with a 1 MΩ resistor as pull-down structure between the barrier region and the second conductive structure. Curve 706 shows the leakage current IL for the case a Zener diode is electrically connected between the barrier region and the second conductive structure as pull-down structure, wherein the anode of the Zener diode is connected to the barrier region and the cathode is connected to the second conductive structure. For bias voltages between 1 kV and the breakdown voltage, the leakage current can be reduced by up to one order of magnitude. The risk of thermal runaway decreases significantly.

Figure 5:
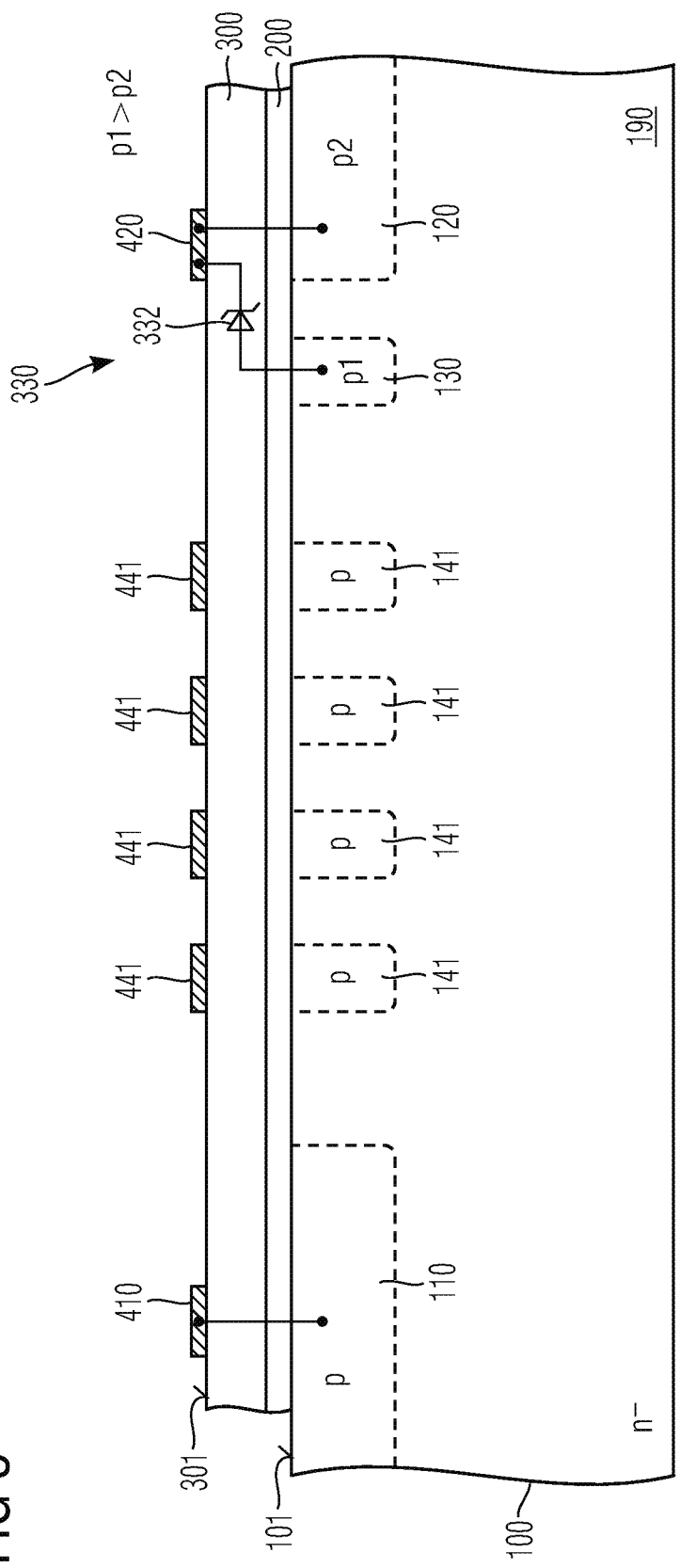
FIG. 5 is a schematic vertical cross-sectional view of a portion of a semiconductor device having a pull-up structure including a Zener diode electrically connected between a barrier region and a second conductive structure according to an embodiment.

In FIG. 5, a first mean net dopant concentration p1 in the barrier region 130 is higher than a second mean net dopant concentration in the second well 120. As a consequence, the barrier region 130 has a first efficiency for charge carrier injection into the base region 190 and the second well 120 has a second efficiency for charge carrier injection into the base region 190, wherein the second efficiency is lower than the first efficiency, and the risk of thermal electrons entering the second well 120 and triggering the injection of holes from the second well 120 into the base region 190 is further reduced.

In particular, the second mean net dopant concentration p2 may be adjusted with respect to the first mean net dopant concentration p1 by the size of openings in an ion implantation mask that partly covers the area of the second well 120 during an ion implantation process. For example, a part of the ion implantation mask above the section of the substrate layer 100 in which the second well 120 is formed has stripe-shaped openings sufficiently narrow such that during a subsequent heat treatment the implanted dopants laterally diffuse sufficiently to form a contiguous second well 120. In this way, all p doped regions in the substrate layer 100 may be formed in one single ion implantation process.

The lower emitter efficiency reduces the risk for a thermal runaway triggered by hole injection from the second well 120 even in the case some thermal electrons reach the second well 120 despite of the presence of the barrier region 130.

In addition, FIG. 5 shows a pull-down structure 330 including a Zener diode 332, wherein the anode of the Zener diode is connected to the barrier region 130 and the cathode of the Zener diode 332 is connected to the second conductive structure 420.

Figure 6:
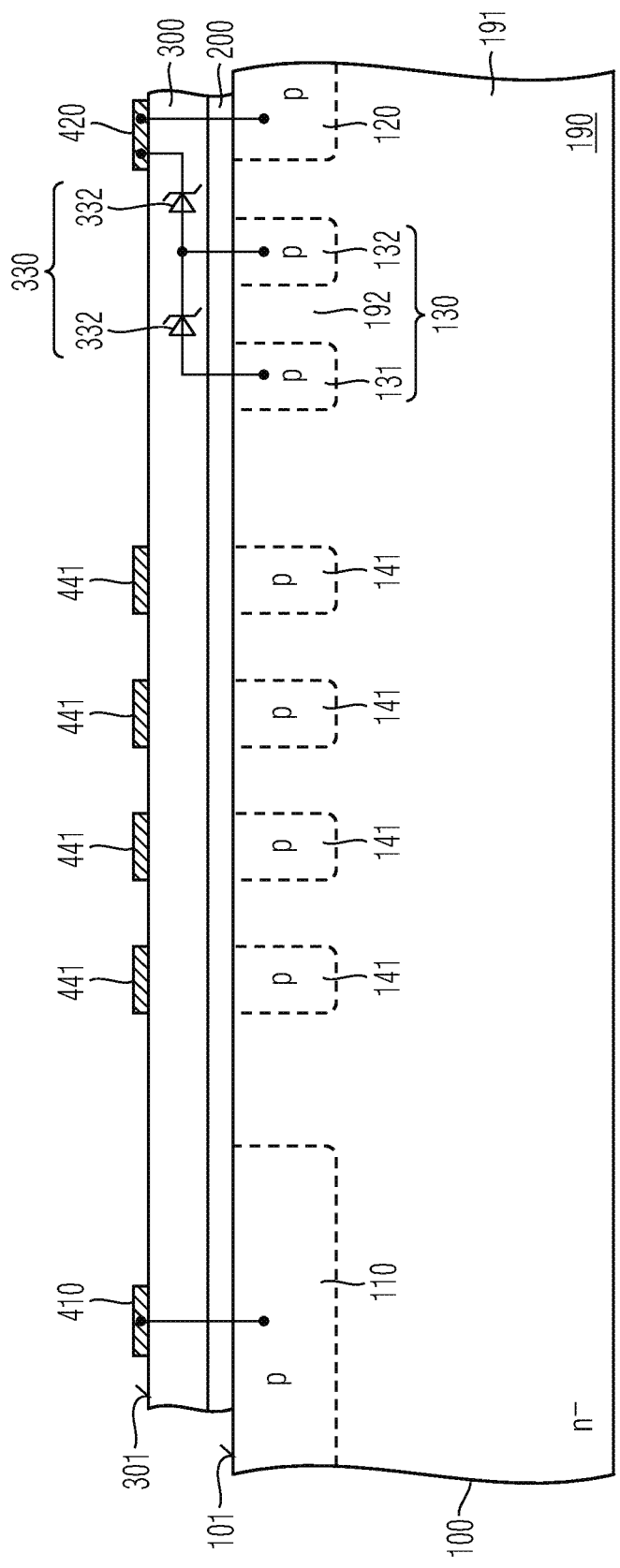
FIG. 6 is a schematic vertical cross-sectional view of a portion of a semiconductor device having a barrier region including two barrier portions and a pull-up structure including Zener diodes connected with each of the barrier portions according to another embodiment.

FIG. 6 shows a barrier region 130 with two laterally separated barrier portions 131, 132. The barrier portions 131, 132 may be concentric circular or rectangular annular structures surrounding the second well 120. A separation section 192 of the base region 190 extending from the first surface 101 to the main section 191 laterally separates the barrier portions 131, 132.

The pull-down structure 330 includes two Zener diodes 332 electrically connected in series between the outer barrier portion 131 and the second conductive structure 420. The inner barrier portion 132 is electrically connected with the node between the two Zener diodes 332.

Figure 7:
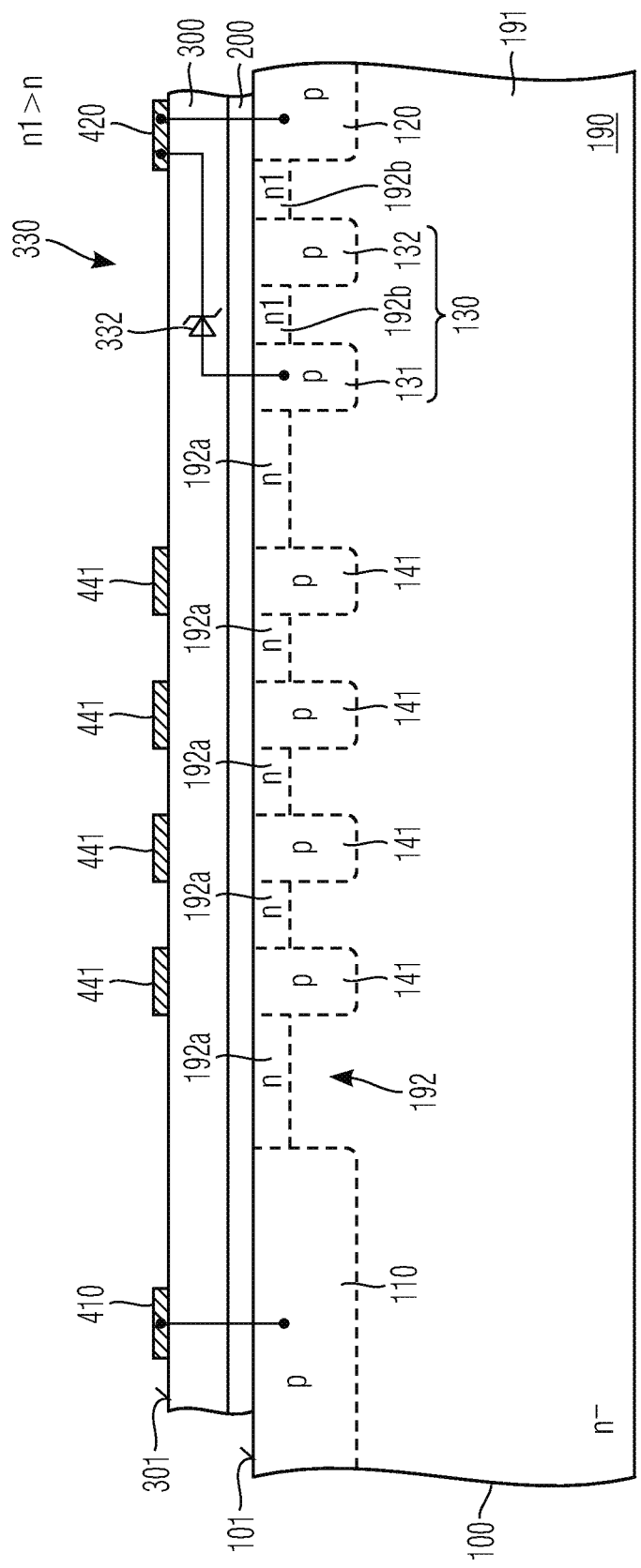
FIG. 7 is a schematic vertical cross-sectional view of a portion of a semiconductor device having a barrier region including two barrier portions and a pull-up structure including a single Zener diode connected with an outer one of the barrier portions according to another embodiment.

In FIG. 7 the pull-down structure 330 includes one single Zener diode 332 electrically connected between the outer barrier portion 131 and the second conductive structure 420.

The base region 190 includes a horizontally contiguous main section 191 below the first well 110, the second well 120, the guard regions 141 and the barrier region 130. The base region 190 further includes separation sections 192 laterally separating the first well 110 and the outermost guard region 141, the guard regions 141 from each other and from the outer barrier portion 131, the barrier portions 131, 132 from each other and the inner barrier portion 132 from the second well 120. Each separation section 192 extends from the first surface 101 down to the main section 191.

Some or all separation sections 192 may include surface sections 192a, 192b extending from the first surface 101 into the substrate layer 100, wherein a vertical extension of the surface sections 192a, 192b is smaller than a vertical extension of the separation sections 192 and wherein a mean net dopant concentration in the surface sections 192a, 192b is at least twice as high as in the lower sections of the separation sections 192 between the surface sections 192a, 192b and the main section 191. For example, the vertical extension of the surface sections 192a, 192b is at most 70% of the vertical extension of the separation sections 192. Some or all surface sections 192a, 192b may result from a same ion implantation process and may have the same vertical extension and the same vertical dopant profile.

In the illustrated embodiment, a mean net dopant concentration in the surface sections 192b between the two barrier portions 131, 132 and between the inner barrier portion 132 and the second well 120 is higher than in the other surface sections 192a between the first well 110 and the outer barrier portion 131, e.g., at least twice as high.

The surface sections 192a, 192b and the lower sections of the separation sections 192 form unipolar junctions, the lower sections of the separation sections 192 and the main section 191 may have the same net dopant concentration, and a mean dopant concentration in the surface sections 192a, 192b may be at least twice as high as in the main section 191.

Figure 8:
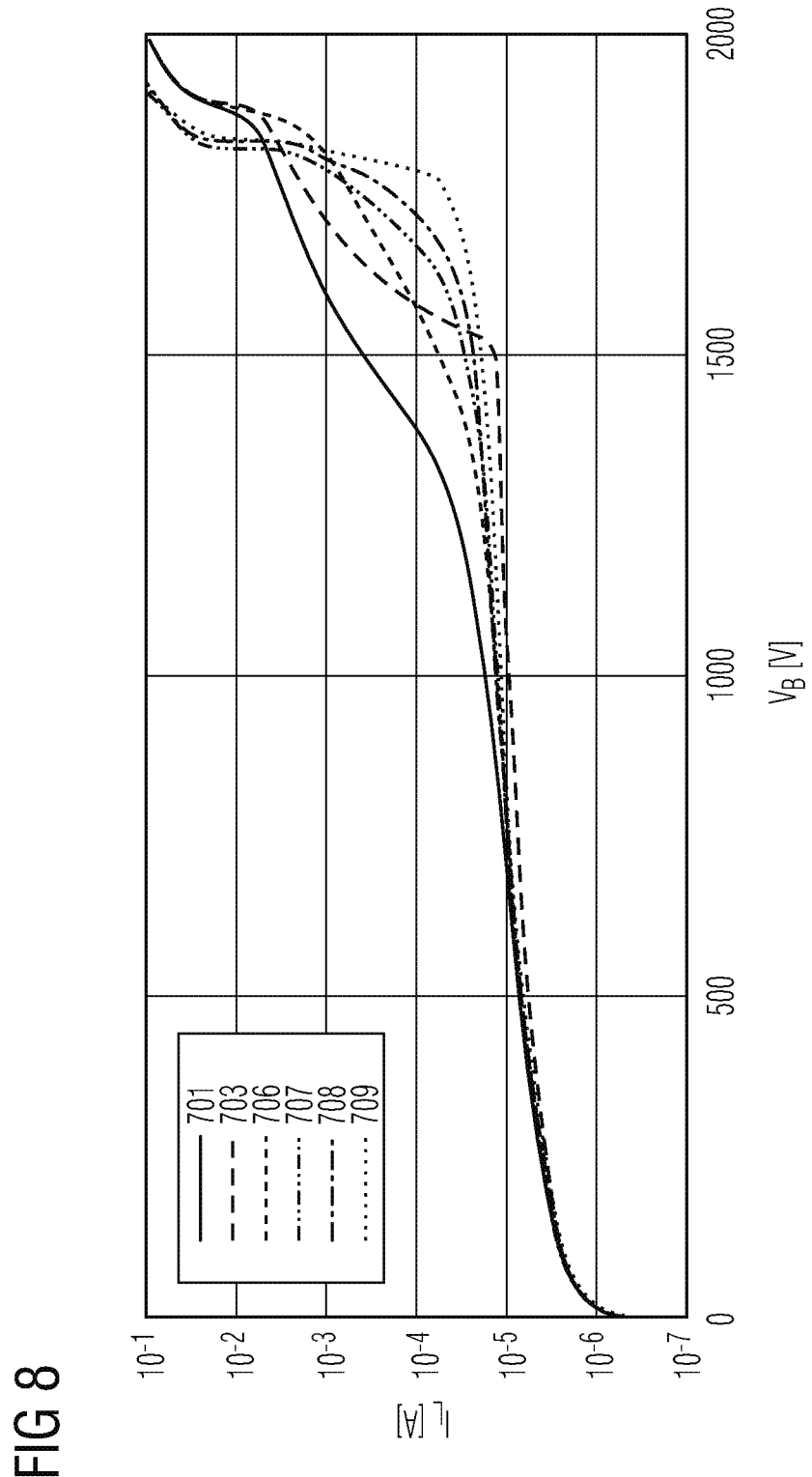
FIG. 8 is a schematic diagram showing the leakage current of a semiconductor device as a function of a bias voltage applied between a second and a first conductive structure, and is used to discuss the effect of the number of barrier portions according to various embodiments.

The curves in FIG. 8 show an exemplary leakage current IL as a function of the voltage bias VB for various barrier structures with different number of barrier portions at a temperature of about 120 degree Celsius. Curve 701 shows the leakage current IL for a reference device without barrier region. Curve 703 shows the leakage current IL for a semiconductor device that differs from the reference device by the presence of a barrier region biased at −10V with reference to the second well. Curve 706 shows the leakage current IL for the case a Zener diode is electrically connected between the barrier region and the second conductive structure, wherein the anode of the Zener diode is connected to the barrier region and the cathode is connected to the second conductive structure. Curve 707 shows the leakage current IL for a barrier region including two laterally separated barrier portions separated from each other and from the second well by separation sections with more heavily doped surface sections 192b as shown in FIG. 7, and with a Zener diode electrically connected between the outer barrier portion and the second conductive structure. Curve 708 shows the leakage current IL for a barrier region including three laterally separated barrier portions and with a Zener diode electrically connected between the outermost barrier portion and the second conductive structure. Curve 709 shows the leakage current IL for a barrier region including six laterally separated barrier portions and with a Zener diode electrically connected between the outermost barrier portion and the second conductive structure.

In particular for bias voltages close to the breakdown voltage, the leakage current significantly decreases with the number of barrier portions.

Figure 9:
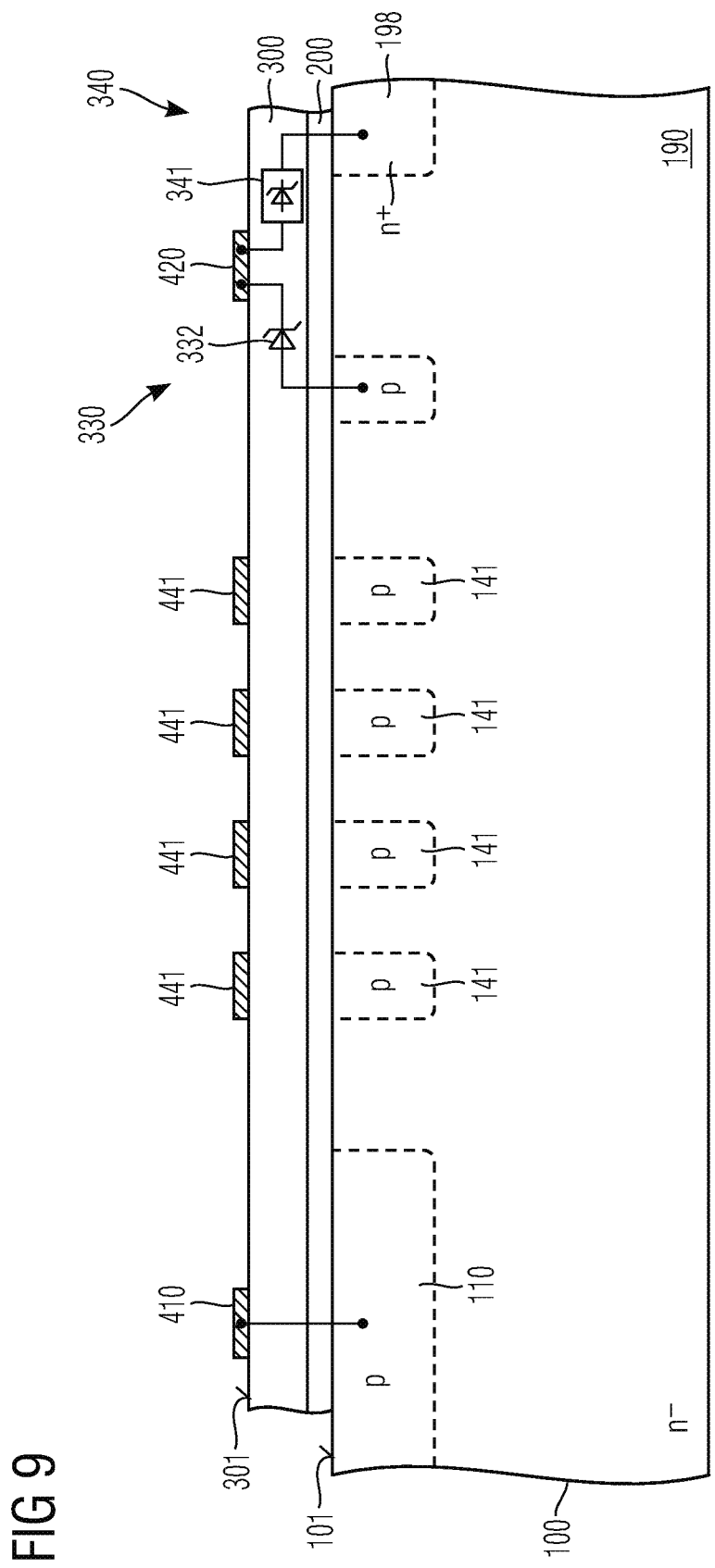
FIG. 9 is a schematic vertical cross-sectional view of a portion of a semiconductor device having a rectifying element between the second conductive structure and a doped contact region of a base region according to another embodiment.

In FIG. 9, the rectifying structure 340 between the second conductive structure 420 and the base region 190 includes a semiconductor diode 341 and a heavily n doped contact region 198. The semiconductor diode 341 is formed outside the substrate layer 100 and is electrically connected between the second conductive structure 420 and the contact region 198. The contact region 198 is formed in the substrate layer 100 and forms a unipolar junction with the base region 190. No second well is formed in the substrate layer 100 and the risk of thermal runaway is further reduced.

Figure 10:
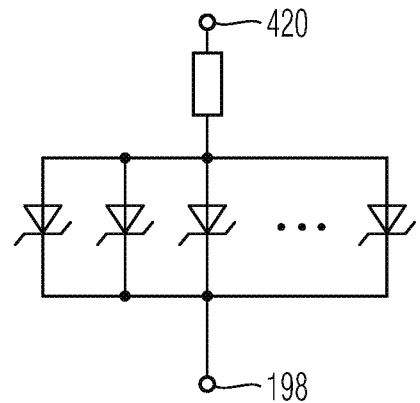
FIG. 10 is a schematic circuit diagram of a rectifying element between the second conductive structure and a doped contact region according to another embodiment.

FIG. 10 shows a rectifying structure 340 that includes a plurality of Zener diodes 342 electrically connected in parallel between the second conductive structure 420 and the heavily n doped contact region 198.

Figure 11:
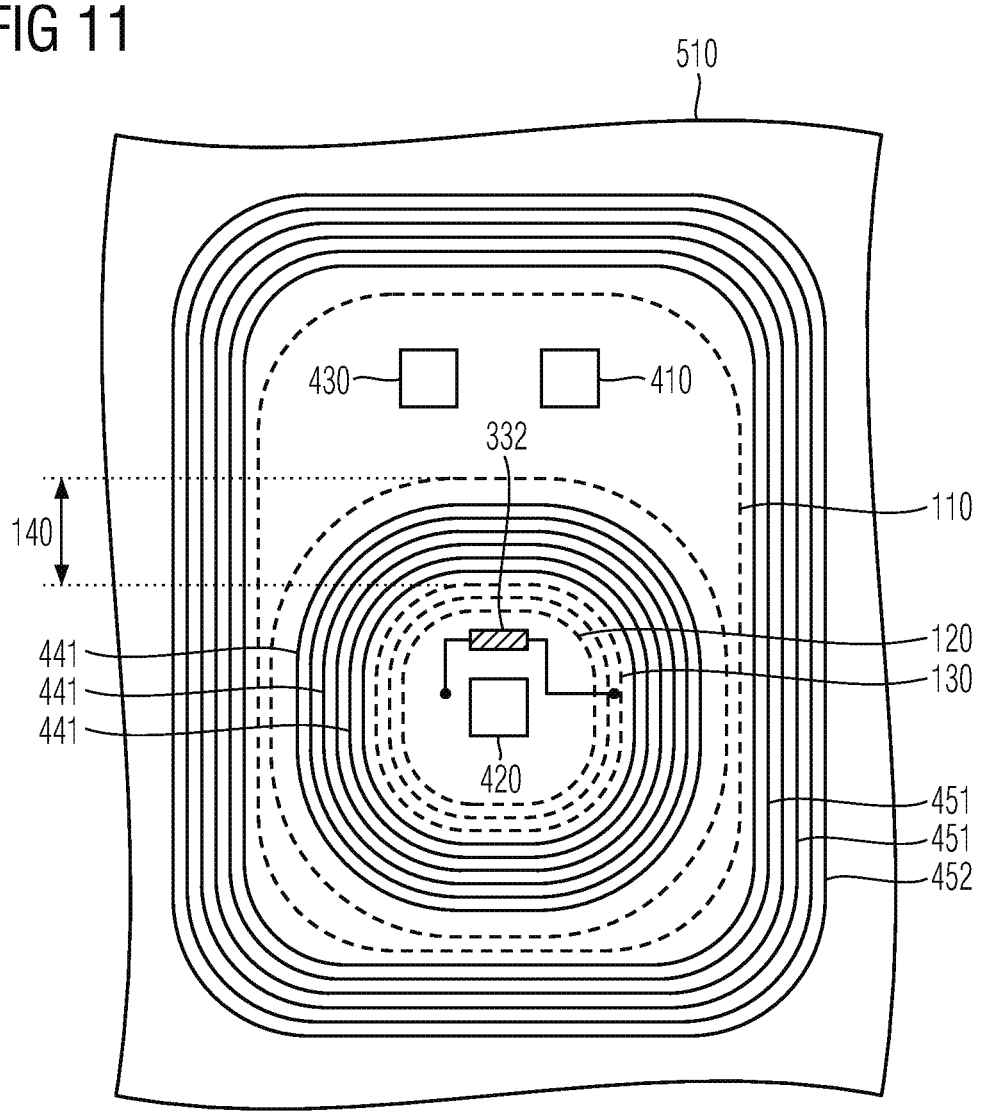
FIG. 11 is a schematic top view of a portion of a semiconductor device with an ESD (electrostatic discharge) diode and a desaturation diode formed in a semiconductor layer of an SOI structure.

FIG. 11 shows a top view of the top surface 301 of a semiconductor layer 300 in which an ESD diode and a desaturation diode of a gate driver circuit 510 are formed. The dashed lines indicate the position of junctions between doped regions in a substrate layer below the semiconductor layer 300.

The substrate layer of the gate driver circuit 510 includes a second well 120, a barrier region 130 surrounding the second well 120, a termination structure 140 with field plates 441 surrounding the barrier region 130 and a first well 110 surrounding the portion of the substrate layer including the second well 120, the barrier region 130 and the termination structure 140 as described with reference to FIG. 3.

A first conductive structure 410 on the first well 110 forms the anode terminal of the ESD diode. A second conductive structure 420 on the second well 110 forms the cathode terminals of the ESD diode and of the desaturation diode. A third conductive structure 430 on the first well 110 forms the anode terminal of the desaturation diode. A supplementary termination structure 150 with supplementary field plates 451 surrounds a portion of the substrate layer including the second well 120, the barrier region 130, the termination structure 140 and the first well 110.

At least the first conductive structure 410 is electrically connected to the first well 110 and the second conductive structure 410 is electrically connected to the second well 120, since the substrate layer provides an uncritical discharge path in case of an electrostatic discharge across the ESD diode. A Zener diode 332 is electrically connected between the barrier region 130 and the second well 120.

Figure 12:
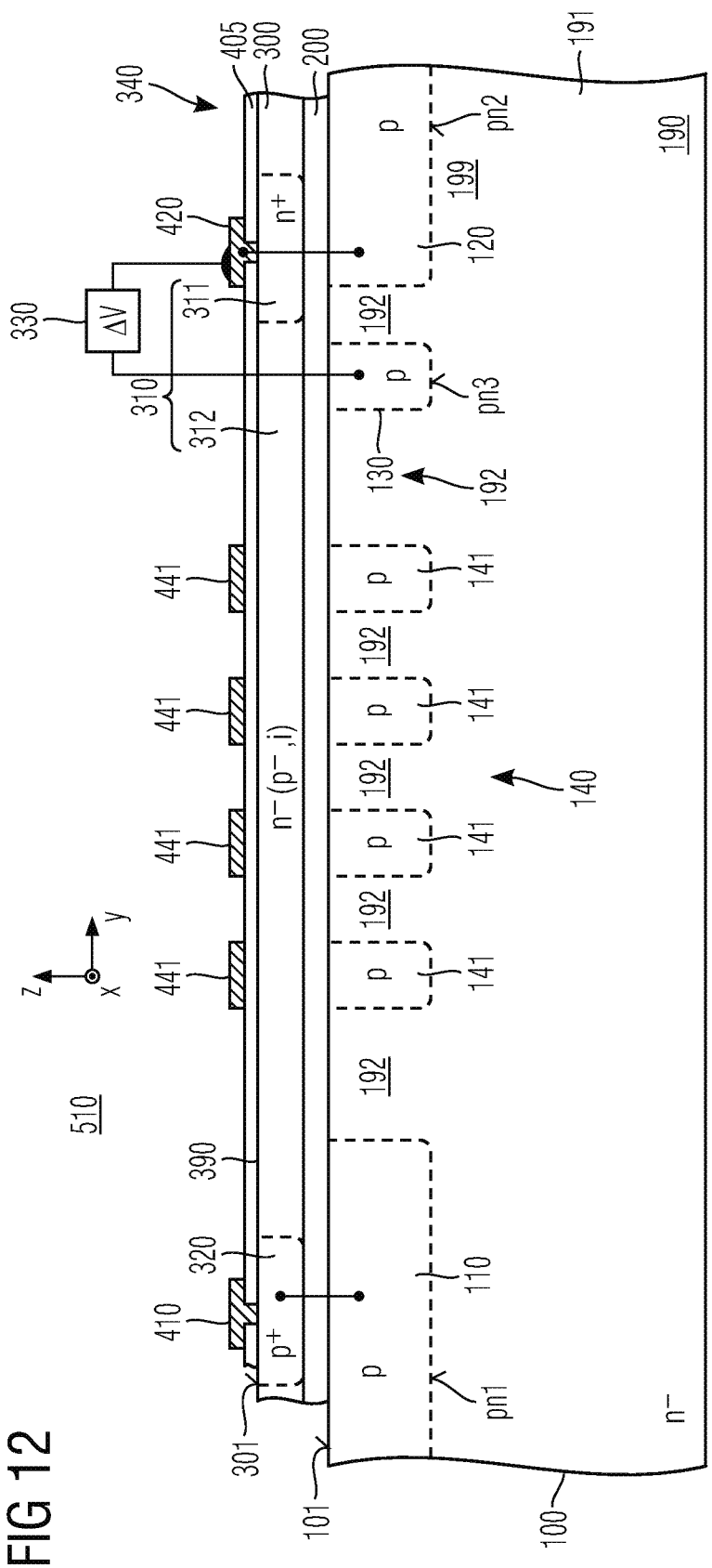
FIG. 12 is a schematic vertical cross-sectional view of a portion of a gate driver circuit including an ESD diode according to another embodiment.

FIG. 12 shows a detail of a gate driver circuit 510 with an ESD diode formed in the semiconductor layer 300 of an SOI structure. FIG. 12 may correspond to a vertical cross-section through the first and second conductive structures 410, 420 in FIG. 11.

The semiconductor layer 300 includes a p doped main region 390. The ESD diode includes a p conductive anode region 320 and an n conductive cathode region 310 that includes a more heavily doped cathode contact region 311 and more lightly doped cathode extension region 312. The anode region 320, the cathode contact region 311 and the cathode extension region 312 extend from the top surface 301 into the semiconductor layer 300 and may extend down to the insulator layer 200 as illustrated. The cathode extension region 312 may include several stripe portions laterally separated along the x-axis and may be lightly n doped, lightly p doped or intrinsic. An interlayer dielectric 405 covers the top surface 301.

The first conductive structure 410 extends through an opening in the interlayer dielectric 405 and forms an ohmic contact with the anode region 320. The second conductive structure 420 extends through another opening in the interlayer dielectric 405 to the semiconductor layer 300 and forms an ohmic contact with the cathode contact region 311. The cathode extension region 312 extends laterally along the y-axis from the cathode contact region 311 to the anode region 320.

A first low-resistive ohmic path electrically connects the first conductive structure 410 and the first well 110. For example, the first well 110 and the anode region 320 are formed along the z-axis and a first through contact via extending through an opening in the insulator layer 200 electrically connects the first conductive structure 410, the anode region 320 and the first well 110.

A second low-resistive ohmic path electrically connects the second conductive structure 420 and the second well 120. For example, the second well 120 and the cathode contact region 311 are formed along the z-axis and a second through contact via extending through an opening in the insulator layer 200 electrically connects the second conductive structure 420, the cathode contact region 311 and the second well 120.

The ESD diode and a portion of the substrate layer 100 between the first and second wells form parallel discharge paths in case of an electric discharge through the ESD diode.

FIG. 13 shows a detail of a gate driver circuit 510 with a desaturation diode formed in the semiconductor layer 300 of an SOI structure. FIG. 13 may correspond to a vertical cross-section through the second and third conductive structures 420, 430 in FIG. 11.

Other than the first conductive structure 410 of the ESD diode shown in FIG. 12, the third conductive structure 430 is without ohmic connection to the first well 110.

In case the desaturation diode of FIG. 13 is combined with the ESD diode shown in FIG. 12, the ESD diode and the additional discharge path through the substrate layer 100 efficiently protect the desaturation diode against ESD events.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a substrate layer comprising a floating base region of a first conductivity type;
   a first well of a second conductivity type, wherein the first well and the floating base region form a first pn junction;
   a first conductive structure electrically connected to the first well;
   a barrier region of the second conductivity type, wherein the barrier region and the floating base region form an auxiliary pn junction;
   a second conductive structure electrically connected to the floating base region through a rectifying structure; and
   a pull-down structure configured to produce a voltage drop between the barrier region and the second conductive structure, when charge carriers cross the auxiliary pn junction.

2. The semiconductor device of claim 1, further comprising:
   an insulator layer on a first surface of the substrate layer, wherein the first well and the barrier region extend from the first surface into the substrate layer; and
   a semiconductor layer on the insulator layer, wherein the first and second conductive structures are on a top surface of the semiconductor layer and/or in the semiconductor layer.

3. The semiconductor device of claim 1, further comprising:
   a termination structure between the first well and the barrier region.

4. The semiconductor device of claim 1, wherein the first well laterally surrounds the barrier region.

5. The semiconductor device of claim 1, further comprising:
   a second well of the second conductivity type, wherein the second well and the floating base region form a second pn junction, wherein the barrier region is formed between the first well and the second well, and wherein the second well and the second conductive structure are electrically connected.

6. The semiconductor device of claim 5, wherein the barrier region laterally surrounds the second well.

7. The semiconductor device of claim 5, wherein the barrier region has a first efficiency for charge carrier injection into the floating base region, wherein the second well has a second efficiency for charge carrier injection into the floating base region, and wherein the second efficiency is lower than the first efficiency.

8. The semiconductor device of claim 1, wherein the barrier region comprises at least two laterally separated barrier portions.

9. The semiconductor device of claim 1, wherein the rectifying structure comprises a semiconductor diode outside the substrate layer.

10. The semiconductor device of claim 1, wherein the rectifying structure comprises a heavily doped contact region in the substrate layer, wherein the contact region has the first conductivity type, and wherein the contact region and the floating base region form a unipolar junction.

11. The semiconductor device of claim 1, wherein the pull-down structure comprises at least one of a capacitive structure and a resistive structure.

12. The semiconductor device of claim 1, wherein the pull-down structure comprises at least one pn junction outside the substrate layer.

13. The semiconductor device of claim 1, further comprising:
   a diode structure on the first surface, wherein the diode structure is electrically connected between the first conductive structure and the second conductive structure.

14. A gate driver circuit, comprising:
   a substrate layer comprising a floating base region of a first conductivity type;
   a first well of a second conductivity type, wherein the first well and the floating base region form a first pn junction;

a first conductive structure electrically connected to the first well;

a barrier region of the second conductivity type, wherein the barrier region and the floating base region form an auxiliary pn junction;

a second conductive structure electrically connected to the floating base region through a rectifying structure;

a pull-down structure configured to produce a voltage drop between the barrier region and the second conductive structure, when charge carriers cross the auxiliary pn junction; and a half-bridge driver circuit comprising two transistors electrically connected in series between a high potential line and a low potential line.

15. The gate driver circuit of claim 14, further comprising:

an insulator layer on a first surface of the substrate layer, wherein the first well and the barrier region extend from the first surface into the substrate layer; and a semiconductor layer on the insulator layer, wherein the first and second conductive structures are on a top surface of the semiconductor layer and/or in the semiconductor layer, and wherein the half-bridge driver circuit is formed in the semiconductor layer.

* * * * *